United States Patent [19]
Mitchell et al.

[11] Patent Number: 6,004,679
[45] Date of Patent: Dec. 21, 1999

[54] LAMINATES CONTAINING ADDITION-CURABLE SILICONE ADHESIVE COMPOSITIONS

[75] Inventors: Tyrone Duncan Mitchell, Corning; Stuart Robert Kerr, III, Troy; Mark Wayne Davis, Clifton Park, all of N.Y.

[73] Assignee: General Electric Company, Pittsfield, Mass.

[21] Appl. No.: 07/669,125

[22] Filed: Mar. 14, 1991

[51] Int. Cl.$^6$ ........................................ B32B 9/04
[52] U.S. Cl. .................... 428/446; 428/447; 428/448; 523/212; 524/264; 524/265; 524/588; 524/730; 524/731; 524/860; 524/861; 524/862; 524/863; 525/474; 528/10; 528/31; 528/32
[58] Field of Search ................... 428/446, 447, 428/448; 523/212; 524/264, 265, 588, 730, 731, 860, 861, 862, 863; 525/474; 528/10, 31, 32

[56] References Cited

U.S. PATENT DOCUMENTS

| | | | |
|---|---|---|---|
| 3,759,968 | 9/1973 | Berger et al. | 556/440 |
| 3,941,741 | 3/1976 | DeZuba et al. | 524/262 |
| 4,256,870 | 3/1981 | Eckberg | 528/15 |
| 4,273,698 | 6/1981 | Smith et al. | 524/263 |
| 4,308,372 | 12/1981 | Smith et al. | 528/34 |
| 4,395,507 | 7/1983 | Dziark et al. | 524/101 |
| 4,764,560 | 8/1988 | Mitchell | 524/506 |
| 4,891,407 | 1/1990 | Mitchell | 525/104 |

FOREIGN PATENT DOCUMENTS

WO-A-8 804 982   7/1988   WIPO.

OTHER PUBLICATIONS

Chemical Abstracts, vol. 99, No. 16, Oct. 17, 1982, Columbus, OH, US; abstract No. 123750W, Flexible printed circuit boards. P. 55; abstract & JP–A–58 021 893 (Sumitomo Bakelite Co., Ltd. & Toshiba Silicone Co., Ltd.( Feb. 8, 1983.

Chemical Abstracts, vol. 97, No. 24, Dec. 13, 1982, Columbus, OH, US; abstract No. 199233J, Fire–resistant flexible printed circuit boards. P. 51; abstract & JP–A–57 085 282 (Sumitomo Bakelite Co., Ltd.) May 27, 1982.

World Patents Index, Section Ch, Week 7806, Derwent Publications Ltd., London, GB; Class A, AN 78–11135A & JP–A–52 154 856 (Shinetsu Chem. Ind. K.K.) Dec. 22, 1977.

*Primary Examiner*—Leszek Kiliman
*Attorney, Agent, or Firm*—Kenneth S. Wheelock; Michelle Bugbee

[57] ABSTRACT

A multilayer laminate having improved peel strength and containing a first and third layer comprising various plastic, metal, or glass materials, and a second layer containing an addition-curable silicone composition curable to form an adhesive having good physical properties and improved peel adhesion properties, the second layer comprising (A) a vinyl-containing polydiorganosiloxane composition, (B) a hydrogen-terminated polysiloxane, preferably in an amount sufficient to provide an adhesion-promoting molar ratio of silicon-bonded hydrogen atoms in (B) to olefinically unsaturated radicals in (A); (C) a catalytic amount of a platinum-containing hydrosilation catalyst; (D) an effective amount of an adhesion promoter selected from the group consisting of (i) bis[3-(trimethoxysilyl)alkyl]-fumarates; (ii) bis[3-(trimethoxysilyl)alkyl]maleates; (iii) allyl-[3-(trimethoxysilyl)alkyl]maleates; (iv) allyl-[3-(trimethoxysilyl)alkyl]fumarates; and (v) N-[3-(trimethoxysilyl) alkyl]maleimides, wherein $R^2$, $R^3$, and $R^4$ are each alkyl radicals of 1 to about 8 carbon atoms; and (E) from about 0 to about 200 parts of an extending filler; and (F) from about 0 to about 50 parts of a reinforcing filler.

37 Claims, No Drawings

LAMINATES CONTAINING ADDITION-CURABLE SILICONE ADHESIVE COMPOSITIONS

BACKGROUND OF THE INVENTION

This invention relates to laminates of plastics, metals, or glass. More particularly, this invention relates to multilayer laminates of plastics, metals, or glass, wherein the laminates contain an addition-curable silicone adhesive composition between the layers of the laminate.

Multilayer laminates containing plastic, metal, or glass substrates have many uses in the marketplace. One particularly important application is in flexible circuits containing multilayer laminates of bonded polyimide or polyester film and copper or aluminum foil. Current flexible circuit processing is all manual and requires extensive press-cure times for manufacture. The projected high growth of the flexible circuit market is critically limited by the high labor assembly costs and the lack of processing speed. It is continually desirable, therefore, to discover ways to increase the speed of producing the flexible circuits.

Generally, an adhesive composition is used to bind the layers in a multilayer laminate. There are several critical properties necessary for an adhesive composition to be useful in high productivity lamination processing. Among these are fast cure, high peel strength, excellent thermal-dimensional stability, and innerlayer stress-management capability. In addition, such compositions must be solventless and able to bond directly to plastic, glass, and metal substrates, i.e., without the use of primer between the adhesive composition and the substrate.

Adhesives presently used in flexible circuit laminates include reactive epoxies, modified epoxies, acrylics, polyesters, and thermoplastic adhesives such as fluoroethylenepropylene. These adhesives do not have all of the properties recited above as critical to the effective performance of an adhesive in high productivity lamination processes.

Thus, it is continually desirable to provide a multilayer laminate of plastic, metal or glass, wherein the laminate contains an improved adhesive, wherein the adhesive does not require solvent or primer, has high peel strength, excellent thermal-dimensional stability, and innerlayer stress-management capability.

The present invention is directed to multilayer laminates containing at least 2 substrates selected from various plastic, metal or glass materials, and containg a solventless, addition-curable silicone adhesive composition which contains an adhesion promoter selected from certain silylfumarates, silylmaleates, or silylmaleimide compounds and which cure to form superior adhesives having excellent physical and adhesive properties and which will adhere to various substrates without the use of a primer and which also has the other properties recited above as necessary to make it an effective adhesive in the manufacture of industrial laminates of plastic, metal, or glass, e.g., flexible circuits.

The use of silylfumarate and silylmaleate compounds as adhesion promoters in silicone compositions is known in the art. Reference is made, for example, to U.S. Pat. Nos. 3,941,741 (De Zuba et al.), which discloses the use of a maleate, fumarate, silylmaleate, or silylfumarate compound as a self-bonding additive in a heat-curable silicone rubber composition. Reference is further made to U.S. Pat. No. 4,273,698 (Smith, Jr. et al.); U.S. Pat. No. 4,308,372 (Smith, Jr. et al.); and U.S. Pat. No. 4,395,507 (Dziark et al.), which disclose the use of a silyl maleate, a silyl fumarate, or a silyl succinate as an adhesion promoter in room temperature curable silicone compositions.

The use of silylfumarate and silylmaleate compounds as adhesion promoters in addition-curable silicone compositions is also known in the art. Reference is made, for example, to U.S. Pat. No. 4,891,407 (Mitchell).

U.S. Pat. No. 4,891,407 to Mitchell is directed to a composition having interpenetrating matrices containing two polymer networks. The first is any polymer that is capable of being stretched, drawn, or expanded so as to obtain a microstructure characterized by nodes interconnected by very small fibrils and is preferably polytetrafluoroethylene. The second polymer network can be an addition curable silicone composition containing an alkenyl-containing polydiorganosiloxane, an organohydrogenpolysiloxane, an organic peroxide or a precious metal-containing catalyst, and, optionally, a reinforcing organopolysiloxane resin, extending and/or reinforcing fillers. The addition-curable composition preferably further contains an adhesion promoter which Mitchell discloses can be any of the maleate and fumarate-functional silanes disclosed in U.S. Pat. No. 3,759,968 to Berger et al., which can be a silylmaleate or silylfumarate, such as bis[3-(trimethoxysilyl)-propyl]maleate or bis[3-(trimethoxysilyl)propyl]fumarate.

SUMMARY OF THE INVENTION

The present invention provides a multilayered laminate comprising at least three layers and having improved peel strength, comprising:

(1) a first layer, comprising a material selected from:
  (a) plastic materials selected from polyphenyleneistyrene blends, polyacrylamides, polystyrenes, conditioned polycarbonates, polyesters, polyimides, polybutylene terephthalates, and polyetherimides;
  (b) metal materials selected from alclad aluminum, anodized aluminum, galvanized steel, cold-rolled steel, cast aluminum, and cast magnesium, and copper; and
  (c) glass materials;
(2) a second layer comprising an addition curable silicone adhesive composition directly bonded to the first layer in the absence of a primer, the composition comprising by weight:
  (a) 100 parts of a vinyl-containing polydiorganosiloxane composition comprising:
(1) from about 50 to about 100 parts by weight of an essentially cyclic-free vinyl-terminated polydiorganosiloxane having the general formula $$R_2ViSiO(R_2SiO)_m(RViSiO)_nSiR_2Vi \qquad (I)$$

wherein Vi represents a vinyl radical, R is selected from the class consisting of alkyl radicals of 1 to 8 carbon atoms, phenyl radicals, fluoroalkyl radicals of 3 to 10 carbon atoms and mixtures thereof, wherein "m+n" is a number sufficient to provide a viscosity of 100 to about 100,000 centipoise at 25° C., the vinyl content of the polydiorganosiloxane being from about 0.02 to about 2.0 weight %, and
  (b) from about 0 to about 50 parts by weight of a solid, benzene-soluble vinyl-containing resin copolymer comprising $R^1_3SiO_{1/2}$ units and $SiO_{4/2}$ units wherein each $R^1$ is a vinyl radical or a monovalent hydrocarbon radical free of aliphatic unsaturation and containing no more than six carbon atoms, the ratio of $R^1_3SiO_{1/2}$ units to $SiO_{4/2}$ units from about 0.5:1 to about 1.5:1, the resin having a vinyl content of from about 1.5 to about 3.5% by weight;

(B) a hydrogen-containing polysiloxane having an average unit formula

(II)

wherein $R^2$ is a monovalent hydrocarbon radical or halogenated monovalent hydrocarbon radical having from 1 to about 10 carbon atoms and free of aliphatic unsaturation, "a" is a value of from about 0 to about 3, "b" is a value of from about 0 to about 3, and the sum of "a"+"b" is from 0 to 3, there being at least two silicon-bonded hydrogen atoms per molecule; the polysiloxane being present in an amount sufficient to provide a molar ratio of silicon-bonded hydrogen atoms in (B) to olefinically unsaturated radicals in (A) of from about 0.75:1 to about 25:1;

(C) a catalytic amount of a hydrosilation catalyst;

(D) an effective amount of an adhesion promoter selected from the group consisting of (i) bis[3-(trimethoxysilyl)alkyl]fumarates having the general formula:

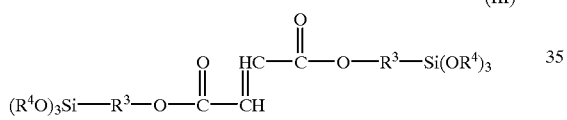
(III)

(ii) bis[3-(trimethoxysilyl)alkyl]maleates having the general formula:

(IV)

CH—C—O—R³—Si(OR⁴)₃
‖
CH—C—O—R³—Si(OR⁴)₃
‖
O (iii) mixtures of (i) and (ii);

(iv) allyl-[3-(trimethoxysilyl)alkyl]maleates having the general formula (V)

CH—C—O—R³—Si(OR⁴)₃
‖
CH—C—O—R⁵
‖
O (v) allyl-[3-(trimethoxysilyl)alkyl]fumarates having the general formula

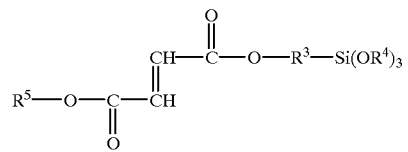
(VI)

(vi) N-[3-(trimethoxysilyl)alkyl]maleimides having the general formula

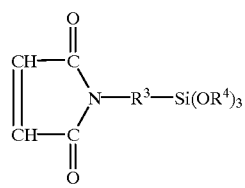
(VII)

wherein $R^3$, $R^4$, and $R^5$ are each alkyl radicals of 1 to about 8 carbon atoms; and (E) from about 0 to about 200 parts of an extending filler; and (F) from about 0 to about 50 parts of a reinforcing filler; and (3) a third layer, to which is directly bonded in the absence of a primer the addition curable silicone adhesive composition of (2), the third layer comprising a material selected from:

(a) plastic materials selected from polyphenylene/styrene blends, polyacrylamides, polystyrenes, conditioned polycarbonates, polyesters, polyimides, polybutylene terephthalates, and polyetherimides;

(b) metal materials selected from alclad aluminum, anodized aluminum, galvanized steel, cold-rolled steel, cast aluminum, and cast magnesium, and copper; and (c) glass materials.

The multilayer laminates of this invention have improved peel strength and are highly useful in industrial laminate applications.

DETAILED DESCRIPTION OF THE INVENTION

Although described in terms of three layers, the laminates of the present invention may comprise more than three layers. It is only critical to the present invention that the layers be in the order as described hereinbelow. The multilayer laminates of the present invention contains at least three layers, the first and third layers each being selected from (a) plastic materials selected from polyphenylene/styrene blends, polyacrylamides, polystyrenes, conditioned polycarbonates, polyesters, polyimides, polybutylene terephthalate, and polyetherimides;

(b) metal materials selected from alclad aluminum, anodized aluminum, galvanized steel, cold-rolled steel, cast aluminum, and cast magnesium, and copper; and (c) glass materials.

If the laminate of the present invention is used in a flexible circuit, the first layer is preferably comprised of polyimide or polyester and the third layer is preferably comprised of alclad aluminum, anodized aluminum, or copper.

The second layer is an adhesive composition which bonds to the first and third layers directly, that is, without a primer.

Component (A)(1) of the composition of the present invention is an essentially cyclic-free vinyl-terminated polydiorganosiloxane having the general formula

$$R_2ViSiO(R_2SiO)_m(RViSiO)_nSiR_2Vi \qquad (1)$$

wherein Vi represents a vinyl radical, R is selected from the class consisting of alkyl radicals of 1 to 8 carbon atoms, phenyl radicals, fluoroalkyl radicals of 3 to 10 carbon atoms and mixtures thereof, wherein "m+n" is a number sufficient to provide a viscosity of 100 to about 100,000 centipoise at 25° C., at least 95%, and preferably 100%, of all R radicals being methyl.

The vinyl-terminated polydiorganosiloxane of formula (I) preferably has a viscosity of from about 3000 to about 95,000 centipoise at 25° C. Radicals represented by R are preferably alkyl radicals of 1 to about 4 carbon atoms, and most preferably methyl.

Component (A)(2) is a vinyl-containing benzene-soluble siloxane resin containing $R^1_3SiO_{1/2}$ units (M units) and $SiO_{4/2}$ units (Q units), wherein each $R^1$ is a vinyl radical or a monovalent hydrocarbon radical free of aliphatic unsaturation and containing no more than six carbon atoms, the ratio of $R^1_3SiO_{1/2}$ units to $SiO_{4/2}$ units from about 0.5:1 to about 1.5:1, the resin having a vinyl content of from about 1.5 to about 3.5% by weight. Component (A)(2) will sometimes be referred to herein as the "vinyl MQ resin".

Component (A)(2) may further contain (i) $R^1_2SiO_{2/2}$ units, (ii) $R^1SiO_{1/2}$ units, or both (i) and (ii), the $R^1_2SiO_{2/2}$ units being present in an amount equal to from about 0 to about 10 mole percent based on the total number of moles of siloxane units in (A)(2); and the $R^1SiO_{1/2}$ units being present in an amount equal to from about 0 to about 10 mole percent based on the total number of moles of siloxane units in (A)(2).

Component (A) comprises from about 50 to about 100, preferably from about 60 to about 100, and most preferably from about 60 to about 75, parts by weight of (A)(i) and from about 0 to about 50, preferably from about 0 to about 40, and most preferably from about 25 to about 40, parts by weight of (A)(2).

In one preferred embodiment of the composition of the present invention, component (A) comprises from about 60 to about 75 parts by weight of (1) a vinyl terminated polydiorganosiloxane having a viscosity of 65,000 to about 95,000 centipoise at 25° C., and (2) from about 25 to about 40 parts by weight of the vinyl-containing MQ resin.

In another preferred embodiment of the composition of the present invention, component (A) comprises from about 60 to about 75 parts by weight of (1) a vinyl terminated polydiorganosiloxane having a viscosity of 3000 to about 4000 centipoise at 25° C., and (2) from about 25 to about 40 parts by weight of the vinyl-containing MQ resin.

In another embodiment of the composition of the present invention, component (A) comprises 100 parts by weight of a (1) a blend containing from about 25 to about 35 parts by weight of a vinyl-containing polydiorganosiloxane of formula (I) and having a viscosity of 3000 to about 5000 centipoise at 25° C. and from about 65 to about 75 parts by weight of a vinyl-containing polydiorganosiloxane of formula (I) above and having a viscosity of 75,000 to about 95,000 centipoise at 25° C., the total amount of (1) being 100 parts by weight. Preferably, (A) further comprises (2) from about 5.5 to about 7.5 parts by weight of a low viscosity polydiorganosiloxane composition having an average of at least one vinyidiorganosiloxy endgroup, a vinyl content of from about 0.2 to about 0.3% by weight and a viscosity of from about 400 to about 700 centipoise at 25° C.; (3) from about 5.5 to about 7.5 parts by weight of a low viscosity vinyidiorgano-endstopped vinylorganodiorganopolysiloxane having a vinyl content of from about 1.4 to about 2.0% by weight and a viscosity of from about 300 to about 600 centipoise at 25° C.; and (4) 0 parts by weight of the vinyl MQ resin.

Component (B) of the composition of the present invention is an organohydrogensiloxane. The organohydrogenpolysiloxane functions as a crosslinking agent and has the average formula:

$$(R^2)_a(H)_bSiO_{(4-a-b)/2} \qquad (II)$$

wherein $R^2$ is a monovalent hydrocarbon radical or halogenated monovalent hydrocarbon radical having from 1 to about 10 carbon atoms and free of aliphatic unsaturation, "a" is a value of from about 0 to about 3, "b" is a value of from about 0 to about 3, and the sum of "a"+"b" is from 0 to 3, there being at least two silicon-bonded hydrogen atoms per molecule.

A preferred organohydrogensiloxane as cross-linking agent in the present invention is that of the formula

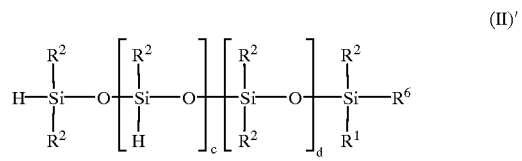

(II)' wherein $R^2$ is as defined above, $R^6$ is $R^2$ or hydrogen, "c" and "d" are values such that the sum of "c"+"d" is sufficient to provide a viscosity of from about 10 to about 1000, the organohydrogensiloxane fluid having a hydrogen content of from about 0.02 to about 1.6% by weight.

It should be noted that even though the above compound of formula (II)' is linear, hydride-containing branch-chained polymers can also be used as hydride cross-linking agents in the instant invention. However, a linear polymer such as that of formula (II)', is preferred because it results in a cured elastomer having optimum physical properties.

In formula (II)', $R^2$ is preferably selected from alkyl radicals of 1 to 8 carbon atoms, phenyl, fluoroalkyl radicals of 3 to 10 carbon atoms and hydrogen, the preferred fluoroalkyl radical being trifluoropropyl. Most preferably, $R^2$ represents a methyl radical. $R^6$ is $R^2$ or hydrogen.

The hydride polysiloxane polymer of formula (II)' has a viscosity of from about 10 to about 1000 and preferably from about 10 to about 150 centipoise at 25° C.

Other hydride cross-linking agents which can be used in the present invention include fluid siloxane copolymer resins comprised of $SiO_{4/2}$ units and $R^2_2HSiO_{1/2}$ units; the ratio of $R^2_2HSiO_{1/2}$ units to $SiO_{4/2}$ units being from about 0.4:1 to about 2.0:1, the hydrogensiloxane copolymer resin having a hydrogen content of from about 0.8 to about 1.2% by weight. Organohydrogen-polysiloxanes having at least one $R^2$ group, preferably, a methyl group, bonded to the silicon atoms that bear the reactive hydrogen atoms are preferred. It is to be understood that component (B) can be a single compound or a mixture of compounds as long as the average unit formula is as indicated and the indicated compatibility is realized. Hydride resinous siloxanes suitable for use in the present invention are disclosed, for example, in U.S. Pat. No. 4,061,609 to Bobear, which is hereby incorporated by reference herein.

Other hydrogen-containing siloxanes which can be used in this invention are linear triorgano-endstopped organohydrogen-polysiloxane fluids having a hydrogen content of about 1.6% by weight. These hydrides generally have the formula $$(R^2)_3SiO(HR^2SiO)_eSi(R^2)_3$$

wherein $R^2$ is as previously defined herein and "e" is a number sufficient to provide a viscosity of from about 10 to about 40 centistokes at 25° C.

It is preferred that the organohydrogensiloxane (B) have a hydride content broadly of 0.05 to 1.6% and more preferably of 0.1 to 1% by weight.

The organohydrogensiloxane (B) must be present in the composition in an amount sufficient to provide a molar ratio of silicon-bonded hydrogen atoms in (B) to olefinically unsaturated radicals in (A) of from about 0.75:1 to about 25:1. Preferably, the organohydrogensiloxane (B) is present in the composition in an amount sufficient to provide an adhesion-promoting molar ratio of silicon-bonded hydrogen atoms in (B) to olefinically unsaturated radicals in (A). This ratio will be dependent on the particular (A) components and (B) components used. In general, the organohydrogensiloxane (B) is present in an amount sufficient to provide a molar ratio of silicon-bonded hydrogen atoms in (B) to olefinic unsaturated radicals in (A) of from about 0.75:1 to 25:1, preferably from about 0.75:1 to about 10:1, and most preferably from about 1.6:1 to about 3.5:1.

Component (C) of the composition of the present invention is a catalyst which promotes the hydrosilation reaction. Useful catalysts for facilitating the hydrosilation curing reaction include precious metal catalysts such as those which use ruthenium, rhodium, palladium, osmium, iridium, and platinum, and complexes of these metals. Examples of suitable hydrosilation catalysts for use in the present invention are disclosed, for example, in U.S. Pat. Nos. 3,159,601 and 3,159,662 (Ashby); 3,220,970 (Lamoreaux); 3,814,730 (Karstedt); 3,516,946 (Modic), and 4,029,629 (Jeram); all of the foregoing patents being hereby incorporated by reference herein.

Preferably, the hydrosilation catalyst is a piatinum-containing catalyst. One preferred platinum-containing catalyst is a platinum octanol complex containing 90.9 weight % octyl alcohol and 9.1 weight % chloroplatinic acid.

Another preferred platinum-containing catalyst is a platinum complexes formed by reacting chloroplatinic acid containing 4 moles of water of hydration with tetravinylcyclotetrasiloxane in the presence of sodium bicarbonate in an ethanol solution. This catalyst is disclosed in U.S. Pat. No. 3,775,452 to Karstedt, which is hereby incorporated by reference herein.

The catalyst must be used in a catalytic amount, which is that amount sufficient to promote the hydrosilation reaction. Generally, there must be utilized at least 0.1 parts per million of a platinum catalyst in terms of parts of platinum metal.

Component (D) of the composition of the present invention is an adhesion promoter selected from the compounds of Formulas (III)–(VII) presented previously herein. The preferred adhesion promoter for use in this invention is a bis[3-(trimethoxysilyl)alkyl]fumarate having the general formula (III) and particularly bis[3-(trimethoxysilyl)propyl]fumarate.

Preferably, in formulas (III)–(VII), $R^3$, $R^4$, and $R^5$ are each alkyl radicals of 1 to about 4 carbon atoms, and most preferably $R^3$ is propyl and $R^4$ and $R^5$ are each methyl.

The most preferred adhesion promoters are the bis[3-(trialkoxysilyl)alkyl]fumarates, the bis[3-(trialkoxysilyl) alkyl]maleates, or mixtures of the foregoing. Most preferably, the adhesion promoter is bis[3-(trimethoxysilyl) propyl]fumarate or bis[3-(trimethoxysilyl)propyl]maleate.

Compounds of formulas (III)–(VI) and methods for preparing them are disclosed in U.S. Pat. Nos. 3,759,968 (Berger et al.); 3,941,741 (De Zuba et al.); 4,308,372 (Smith, Jr. et al.); and 4,256,870 (Eckberg); all of which are incorporated by reference herein.

The compounds of formulas (III)–(VI) can prepared by reacting compounds of the formulas

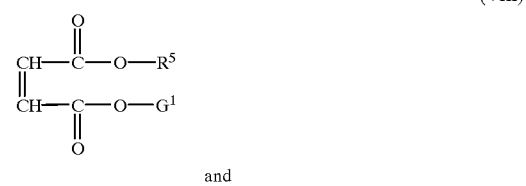

and

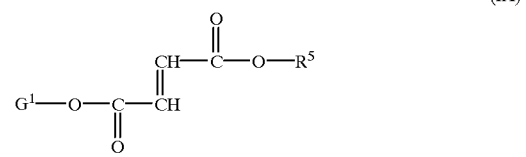

wherein $R^5$ is selected from unsaturated monovalent hydrocarbon radicals and unsaturated halogenated monovalent hydrocarbon radicals, and $G^1$ is selected from hydrogen, monovalent hydrocarbon radicals, halogenated monovalent hydrocarbon radicals, unsaturated monovalent hydrocarbon radicals and unsaturated halogenated monovalent hydrocarbon radicals, with a hydrosilane of the formula $$HSiR^7_nX_{3-n} \qquad (X)$$

in the presence of a platinum catalyst, wherein $R^7$ is selected from monovalent hydrocarbon radicals and halogenated monovalent hydrocarbon radicals, X is a halogen and preferably chlorine, and "n" is a whole number that varies from 0 to 3. If $G^1$ in formulas (VIII) and (IX) is the same as the $R^5$ radical, that is, it is a monovalent unsaturated hydrocarbon radical, the hydrosilane of formula (X) may be added on to both of the unsaturated linkages in the $R^5$ radicals by reacting two moles of the hydrosilane of formula (X) with one mole of the compounds of formulas (VIII) and (IX). If mono-substitution is desired, on the other hand, one mole of the hydrosilane of formula (X) is reacted with one mole of either the maleates and/or fumarates of formulas (Vil) and (IX) and a mono-addition product will be obtained.

The reaction is preferably carried out at room temperature and a solvent is not required. In that case, any inert solvent such as toluene, xylene, mineral spirits, benzene, and the like can be used. Suitable catalysts for the addition of the silane of formula (X) to the compounds of formulas (VIII) and (X) are the various platinum and platinum compound catalysts known in the art. These catalysts include elemental platinum in the finely divided state which can be deposited on charcoal or aluminum, as well as the various platinum compounds such as chloroplatinic acid, a platinum hydrocarbon complex of the type shown in U.S. Pat. Nos. 3,159, 601; 3,159,602; as well as the platinum alcoholic complexes prepared from the chloroplatinic acids which are described in U.S. Pat. No. 3,220,972 (Lamoreaux).

To replace the chlorine atoms, the halosilyl ester or imide may be reacted with an alcohol or an acid of the formula $R^8OH$, $R^8COOH$, wherein $R^8$ is selected from monovalent hydrocarbon radicals and halogenated monovalent hydrocarbon radicals and is preferably a saturated monovalent hydrocarbon, such as alkyl, with no more than 8 carbon atoms. In preparing the reaction mixture, one mole of the halosilylmaleate is reacted with an excess of the alcohol or acid such that the number of moles of alcohol or acid exceeds the number of moles of the halogen attached to the silicon atom, and the reaction is allowed to proceed at reduced pressures and moderate temperatures when it is carried out in the absence of a solvent. The reduced pressures and moderate temperatures are preferred so that the acid that is formed from the alkoxylation or acylation would be boiled off and will not contaminate the desired product. Thus, it is preferred that the reaction be carried out at less than 100 mm of mercury pressure at temperatures in the range of 75° C. to 100° C.

As an alternative, the alkoxylation or acylation reaction may be carried out in the presence of a hydrocarbon solvent, in which solvent the hydrogen chloride that was released is not soluble so that during the course of the reaction, the acid which is given off does not affect the silylmaleate or silylfumarate product which is within the scope of formulas (VIII) and (IX). As an alternative, both the maleates and fumarates of formulas (VIII) and (IX) may be reacted with a hydroalkoxysilane in place of the hydrohalosilane of formula (X). However, with the alkoxysilane, the SiH-olefin addition in the presence of a platinum catalyst proceeds more slowly than in the case where the silane of formula (X) is used.

The adhesion promoter of formula (VII) can be prepared by mixing 0.125 moles of methyltrimethoxysilane and 0.095 moles of maleic anhydride with slight heating, followed by the dropwise addition of 0.095 moles of aminopropyltrimethoxysilane with stirring.

The adhesion promoter (D) is present in the composition of this invention in an effective amount which is that amount sufficient to improve the adhesion of the composition. Typically, the adhesion promoter (D) is present in an amount ranging from about from about 0.5 to about 2.0 percent by weight, and preferably from about 0.75 to about 1.25 percent by weight.

The composition of the present invention may also contain any of the conventional (E) extending and/or (F) reinforcing fillers. The composition contains from about 0 to about 200 and preferably from about 10 to about 100 parts by weight of (E) an extending filler; and from about 5 to about 50, and preferably from about 20 to about 50 parts by weight of (F) a reinforcing filler.

Examples of extending fillers (E) useful herein include alpha quartz, crushed quartz, aluminum oxide, aluminum silicate, zirconium silicate, magnesium oxide, zinc oxide, talc, diatomaceous earth, iron oxide, calcium carbonate, clay, titania, zirconia, mica, glass, such as ground glass or glass fiber, sand, carbon black, graphite, barium sulfate, zinc sulfate, wood flour, cork, fluorocarbon polymer powder and the like. The preferred extending filler for use in the present invention is alpha-quartz.

Examples of reinforcing fillers (F) include silica, such as fumed silica and precipitated silica; and treated silica fillers such as fumed or precipitated silica that has been reacted with, e.g., an organohalosilane, a disiloxane, or a disilazane. Fumed silica is particularly effective as a reinforcing filler for the silicone component of the present invention. A particularly preferred treated fumed silica is one wherein a fumed silica has been treated first with cyclic polysiloxanes, e.g.,dimethylcyclic tetramer, according to the methods known in the art, for example, as taught in U.S. Pat. No. 2,938,009 (Lucas), which is incorporated by reference herein, and then treated with a silazane, e.g., hexamethyidisilazane, for example, as taught in U.S. Pat. Nos. 3,635,743 (Smith) and 3,847,848 (Beers), which are both incorporated by reference herein, so as to remove most of the free silanols on the surface of the tetramer-treated silica. Such a filler is sometimes referred to herein as "treated fumed silica".

The composition of the present invention can be prepared by homogeneously mixing Components (A)–(F) and any optional ingredients, using suitable mixing means, such as a spatula, a drum roller, a mechanical stirrer, a three-roll mill, a sigma blade mixer, a bread dough mixer, and a two-roll mill.

The order of mixing Components (A)–(F) is not critical; however, it is preferred that Components (B) and (C) be brought together in the presence of Component (D), most preferably in a final mixing step. Thus, it is possible to mix all components in one mixing step immediately prior to the intended use of the curable composition. Alternatively, certain components can be premixed to form two or more packages which can be stored, if desired, and then mixed in a final step immediately prior to the intended use thereof.

It is preferred to mix Components (C), (D), and a portion of Component (A), along with certain optional components such as fillers and solvents, to provide a first package and Component (B), along with the remaining portion of Component (A), if any, to provide a second package. These two packages can then be stored until the composition of this invention is desired and then homogeneously mixed.

Curing of the curable composition is typically carried out at a temperature of from about 165° C. to about 200° C. or higher. Cure time generally varies from about 2 minutes to about 3 hours.

The addition-curable composition of this invention will directly self-bond in the absence of primer to various plastic, metal, glass, and masonry substrates. Examples of plastic substrates to which the composition will bond include plastic substrates selected from polyphenylene/styrene blends, polyacrylamides, polystyrenes, conditioned polycarbonates, polyesters, polyimides, polybutylene terephthalates, fluoropolymers and non-resin containing polyetherimides. Examples of metal substrates include metal substrates selected from copper, alclad aluminum, anodized aluminum, galvanized steel, cold-rolled steel, cast aluminum, and cast magnesium. The term "conditioned" with regard to polycarbonate means that the moisture in the polycarbonate substrate must have been reduced to a point where water released during adhesive cure does not interfere with bonding at the interface. Conditioning is typically accomplished by drying the polycarbonate substrate at about 120° C. for about 12–24 hours.

However, if component (A) of the adhesive composition of this invention comprises 100 parts by weight of (1) a blend containing from about 25 to about 35 parts by weight of a vinyl containing polydiorganosiloxane having a viscosity of 3000 to about 5000 centipoise at 25° C. and from about 65 to about 75 parts by weight of a vinyl containing polydiorganosiloxane having a viscosity of 65,000 to about 75,000 centipoise at 25° C. and (2) 0 parts by weight of the vinyl MQ resin, the substrates to which such an adhesive is applied must be free of surface oil, such oil appearing to deleteriously affect the adhesive properties of the cured adhesive composition containing such a vinyl blend.

In addition, it was found that the adhesive composition will not adhere to polycarbonate unless the polycarbonate is "conditioned", as that term is described hereinabove. It has further been observed that the adhesive composition of the present invention sometimes will not bond to polyetherimides containing resin fillers.

In general, the thickness of the various laminate layers will vary according to the substrates. For the purpose of preparing flexible circuit laminations, the thickness of the polyimide and polyester films are typically from about 0.5 mils to about 5.0 mils. The thickness of the copper substrate is typically from about 0.5 mil to about 2.0 mils, and the thickness of the aluminum substrate is typically from about 5.0 mils to about 40 mils. The thickness of the adhesive composition on a substrate is typically from about 0.5 mil to about 50.0 mils.

The composition of this invention is applied to the surface of the substrate by any suitable means such as rolling, spreading, spraying, and the like, and cured as described above. After application of the adhesive composition onto the substrate, the composition is cured at a temperature in the range described previously herein.

As mentioned previously herein, the multilayer laminates of the present invention may comprise more than three layers, as long as the adhesive composition layer (i.e., the "second layer") is present between the first and third layers described hereinbefore. In other words, the laminates of this invention may contain repeating layers wherein the layers are present in the order of first layer layer bonded to second layer bonded to third layer bonded to second layer bonded to first layer and so on.

Thus, the present invention is further directed to a multilayered laminate having improved peel strength and comprising a plurality of alternating layers, comprising:

(1) a plurality of substrate layers, each layer comprising a material selected from the group consisting of:
(a) plastic materials selected from polyphenylene/styrene blends, polyacrylamides, polystyrenes, conditioned polycarbonates, polyesters, polyimides, polybutylene terephthalates, and polyetherimides;
(b) metal materials selected from alclad aluminum, anodized aluminum, galvanized steel, cold-rolled steel, cast aluminum, and cast magnesium, and copper; and
(c) glass materials;

(2) an adhesive layer separating each substrate layer from a preceding or succeeding substrate layer, the adhesive layer comprising an addition curable silicone adhesive composition directly bonded to the substrate layers in the absence of a primer, the composition comprising the ingredients described previously herein.

In order that those skilled in the art may better understand the present invention, the following examples are given to illustrate but not to limit the invention which is fully delineated by the appended claims. All parts in the examples are by weight.

Experimental

Glossary

The following terms used in the examples and tables below are hereinbelow defined:

(1) LV Vinyl Polymer-I—a low viscosity vinyldimethyl-endstopped polydimethylsiloxane having a viscosity of approximately 3300–3900 centistokes at 25° C.

(2) Resin Filler—a vinyl silicone resin containing $MQD^1$ units, wherein M represents $(CH_3)_3SiO_{1/2}$ units, Q represents $SiO_{4/2}$ units, and $D^1$ represents $(CH_3)(Vi)SiO_{2/2}$ units; the resin having a vinyl content of approximately 0.60 to about 0.70% by weight and being present as a 60% solids solution in xylene.

(3) Catalyst-I—a platinum octanol complex containing 90.9 weight % octyl alcohol and 9.1 weight % chloroplatinic acid.

(4) RTV-I—a composition having a viscosity of about 3000–5000 centipoise at 25° C. and containing (a) 75 parts by weight of LV Vinyl Polymer-I; (b) 25 parts by weight of Resin Filler; and (c) 12.5 parts per million of Catalyst.

(5) Treated Fumed Silica-I—a fumed silica filler (surface area 200 $m^2/g$) which has been treated first with octamethylcyclotetrasiloxane and then with hexamethyldisilazane in a manner as described previously herein.

(6) BTMSPF—Bis(3-trimethoxysilylpropyl)fumarate.

(7) BTMSPM—Bis(3-trimethoxysilylpropyl)maleate.

(8) Resin Hydride—a hydride siloxane resin containing $(CH_3)_2HSiO_{1/2}$ units and $SiO_{4/2}$ units, the resin hydride having a hydrogen content of about 0.8 to 1.2 weight %.

(9) RTV-II—a dimethylhydrogen siloxane crosslinking agent having a hydrogen content of approximately 0.43 to 0.46 weight % and containing (a) 100 parts of Low Viscosity Polymer-I and (b) 100 parts of Resin Hydride-I.

(10) HV Vinyl Polymer-I—a vinyl-endstopped dimethylpolysiloxane having a viscosity of approximately 75,000–95,000 centipoise at 25° C.

(11) Inhibitor—3,5-dimethyl-hexyn-3-ol.

(12) Hydride Fluid—a linear hydride fluid having a viscosity of from about 50 to 150 centistokes at 25° C. and a hydride content of 0.18–0.28% by weight.

(13) LV Vinyl Polymer-I/Resin Blend—a blend containing 75 parts of LV Vinyl Polymer-I and 25 parts of Resin Filler, the resulting blend having a viscosity of 3000–5000 centipoise at 25° C.

(14) Catalyst II—a platinum complex formed by reacting chloroplatinic acid containing 4 moles of water of hydration with tetravinylcyclotetrasiloxane in the presence of sodium bicarbonate in an ethanol solution.

(15) Vinyl Blend II—a blend having a viscosity of from about 35,000 to about 45,000 centipoise at 25° C. and containing (a) 64.1 parts by weight of a blend containing (i) 70 parts by weight of HV Vinyl Polymer-I at a viscosity of about 80,000 centipoise at 25° C. and (ii) 30 parts by weight of LV Vinyl Polymer-I at a viscosity of about 4000 centipoise at 25° C.; the total amount of (i) and (ii) being 100 parts by weight; (b) 27.7 parts by weight of Treated Fumed Silica-I; (c) 4.1 parts by weight of a low viscosity polydiorganosiloxane composition having an average of at least one vinyidiorganosiloxy endgroup, a vinyl content of from about 0.2 to about 0.3% by weight and a viscosity of from about 400 to about 700 centipoise at 25° C.; and (d) 4.1 parts by weight of a low viscosity vinyldiorgano-endstopped vinylorganodiorganopolysiloxane having a vinyl content of from about 1.4 to about 2.0% by weight and a viscosity of from about 300 to about 600 centipoise at 25° C.

(16) psi—pounds per square inch.

(17) $H/C_2H_3$—ratio of SiH:SiVinyl groups.

EXAMPLE 1

A composition having the formulation set forth in Table 1 below was prepared.

TABLE 1

Example 1 Formulation

| Ingredients | Parts by Weight |
|---|---|
| RTV-1 | 100 |
| Treated Fumed Silica-I | 25 |
| BTMSPM | 1 |
| RTV-II | 9 |

The composition described in Table 1 was prepared as follows. The treated fumed silica was mixed with RTV-I in a suitable mixer until all of the filler was incorporated into the RTV-I. After incorporation of the filler was complete, the mixture was heated and stirred under full vacuum at 130–135° C. for one hour in a static mixer. The mixture was then cooled to room temperature while under vacuum and slowly brought to atmospheric pressure under an inert atmosphere. The adhesion promoter was then mixed in while under an inert atmosphere. The resulting composition could be packaged for use as a two part adhesive wherein the second part, i.e., RTV-II, would be added later, or, the composition could be packaged as a one-part adhesive wherein the RTV-II is added to the mixer following addition of the adhesion promoter (BTMSPM). The one part adhesive would have a shelf life of approximately two weeks. If a one-part adhesive is desired, a mixture containing all of the ingredients described above is placed under vacuum to remove air and the final product transferred to a suitable container.

The physical properties of the composition prepared in Example 1 are shown in Table 2 below:

TABLE 2

Example 1 Physical Properties

| Physical Property | Example 1 |
|---|---|
| Application Rate (Initial) g/min | 60 |
| Application Rate (21 Days) g/min | 29 |
| Flow, in./3 min. | 0 |
| Specific Gravity | 1.12 |
| Viscosity, centipoise × $10^{-6}$ | 1.6 |
| Shore | 38 |
| Tensile, psi | 800 |
| Elongation, % | 330 |
| Modulus at 50% | 136 |
| Modulus at 75% | 191 |
| Modulus at 100% | 246 |

Example 1 was repeated. The lap shear adhesion characteristics of the composition on various substrates were measured and the results shown in Table 3 below. The lap shear adhesion properties are described in terms of psi/% cohesive failure (bondline thickness, mils.) Curing was carried out at 120° C. for 2 hours.

TABLE 3

Example 1 Lap Shear Adhesion Properties

| Substrate | psi/% Cohesive Failure(bond line thickness, mils) |
|---|---|
| Alclad Aluminum | 892/100 (45) |
| Anodized Aluminum | 770/90 (39) |
| Galvanized Steel | 600/100 (30) |
| Cold-rolled Steel | 627/100 (37) |
| Glass | 300/Broke (14) |
| Polycarbonate | 550/100 (35) |
| Polyphenylene/Styrene Blend | 712/100 (33) |
| Polyacrylamide | 570/100 (40) |
| Sheet Molding Compound | 500/100 (35) |
| Polystyrene | 195/90 (40) |
| Copper | 688/100 (48) |

The results presented in Table 3 above indicate that the composition prepared in Example 1 has excellent adhesion to alclad aluminum, anodized aluminum, galvanized steel, cold-rolled steel, polycarbonate, polyphenylene/styrene blend, polyacrylamide, Sheet Molding Compound, polystyrene, and copper.

EXAMPLES 2–6

Five compositions, having the formulations set forth in Table 4 below, were prepared according to the procedure followed in Example 1.

TABLE 4

Examples 2–6 Formulations

| Ingredient | Amount (% by weight) | | | | |
|---|---|---|---|---|---|
| | Example 2 | Example 3 | Example 4 | Example 5 | Example 6 |
| LV Vinyl Polymer-I | 62.95 | 50.7 | 69.7 | 49.8 | 62.4 |
| Resin Filler | 19.2 | 31.5 | 0 | 0 | 19.1 |
| Treated Fumed Silica-I | 15.4 | 13.4 | 27.9 | 19.8 | 15.3 |
| BTMSPM | 0.77 | 0.79 | 0.70 | 0.70 | 0.76 |
| Resin Hydride | 1.75 | 3.5 | 1.74 | 1.74 | 1.7 |
| HV Vinyl Polymer-I | 0 | 0 | 3.27 | 27.87 | 0 |
| Carbon Black | 0 | 0 | 0 | 0 | 0.76 |

The compositions prepared in Examples 2–6 were cured at 120° C. for 2 hours. The solvent swell of the cured samples was measured and the data provided in Table 5 below. Heat age and oil immersion data for the samples prepared in Examples 2–6 were also measured and are presented in Table 5 below. Three sets of data were taken: (1) "initial", wherein meaurements were taken after curing for 2 hours at 120° C. and before heat aging; (2) "325° F./14d", wherein measurements were made after the sample was cured for 2 hours at 120° C. and then heat aged for 14 days at 325° F.; and (3) "325° F./14d/oil", wherein measurements were made after the sample was cured for 2 hours at 120° C. and then heat aged for 14 days at 325° F. in 10w oil.

TABLE 5

Examples 2–6
Heat-Age, Oil Immersion and Solvent Resistance

| Property | Example 2 | Example 3 | Example 4 | Example 5 | Example 6 |
|---|---|---|---|---|---|
| Shore (Initial) | 46 | 70 | 60 | 37 | 57 |
| Shore (325° F./14d) | 54 | 72 | 61 | 47 | 45 |
| Shore (325° F./14d/Oil) | 40 | 60 | 40 | 19 | 45 |
| Tensile, psi (initial) | 931 | 659 | 1123 | 845 | 931 |
| Tensile, psi (325° F./14d) | 1108 | 490 | 1040 | 837 | 806 |
| Tensile, psi (325° F./14d/Oil) | 440 | 127 | 507 | 332 | 504 |
| % Elongation (initial) | 170 | 40 | 500 | 520 | 170 |
| % Elongation (325° F./14d) | 170 | 20 | 280 | 370 | 130 |
| % Elongation (325° F./14d/Oil) | 60 | 10 | 180 | 240 | 80 |
| Specific Gravity | 1.101 | 1.123 | 1.158 | 1.110 | 1.110 |
| % Weight Change | 11.07 | 10.35 | 12.47 | 20.66 | 10.66 |
| % Volume Change | 13.70 | 12.69 | 16.71 | 26.43 | 13.71 |

Good heat age, oil immersion, and solvent swell results were obtained with the samples prepared in Examples 2–6. The best solvent swell results were obtained with the samples containing the resin filler along with the treated fumed silica (Examples 2, 3, and 6).

The bond line thickness, lap shear, and % cohesive failure data on various substrates for the samples prepared in Examples 2–6 were measured and are presented in Table 6 below. Three sets of data were taken: (1) "initial"; (2) "325° F./14d"; and (3) "325° F./14d/oil", wherein these terms have the meanings indicated in connection with the data presented in Table 5 above.

TABLE 6

Examples 2–6
Lap Shear Adhesion Results
(bondline thickness/psi/% cohesive failure)

| Substrate | Example 2 | Example 3 | Example 4 | Example 5 | Example 6 |
|---|---|---|---|---|---|
| Alclad Aluminum | | | | | |
| Initial | 23/850/100 | 35/1000/100 | 35/920/100 | 38/710/100 | —/—/— |
| 325° F./14d | 24/1021/100 | 26/510/100 | 33/612/20 | 30/550/100 | 20/745l/100 |
| 325° F./14d/Oil | 23/263/0 | 32/299/15 | 34/159/0 | 38/83/0 | 28/495/100 |
| Anodized Aluminum | | | | | |
| Initial | 46/550/100 | 35/920/100 | 30/1080/100 | 39/770/90 | —/—/— |
| 325° F./14d | 25/490/10 | 29/605/50 | 28/780/20 | 23/480/100 | 20/555/100 |
| 325° F./14d/Oil | 25/282/0 | 24/356/20 | 29/188/0 | 20/115/0 | 28/185/10 |
| Cast Aluminum* | | | | | |
| Initial | 25/620/100 | 16/620/100 | 17/320/100 | 13/70/no cure | 15/no cure |
| 325° F./14d | —/—/— | —/—/— | —/—/— | —/—/— | —/—/— |
| 325° F./14d/Oil | 21/299/0 | 23/340/50 | 19/195/0 | 22/50/0 | 18/129/80 |
| Galvanized Steel | | | | | |
| initial | 39/600/100 | 35/790/100 | 40/500/80 | 30/600/100 | —/—/— |
| 325° F./14d | 37/310/0 | 22/575/50 | 38/865/100 | 28/780/100 | 24/960/100 |
| 325° F./14d/Oil | 30/333/10 | 26/300/0 | 20/204/50 | 23/138/20 | 31/233/40 |
| Glass | | | | | |
| Initial | 20/400+/broke | 20/740/100 | 30/glass broke | 14/300+/broke | —/—/— |
| 325° F./14d | 23/glass broke | 17/glass broke | 40/glass broke | 12/300+/broke | —/—/— |
| 325° F./14d/Oil | 11/212/50 | 10/385/0 | 31/120/0 | 15/60/0 | 9/70/0 |
| Cast Magnesium | | | | | |
| Initial | 39/530/100 | 29/1100/100 | 47/780/100 | 26/760/100 | 30/740/100 |
| 325° F./14d | —/—/— | —/—/— | —/—/— | —/—/— | 17/710/100 |
| 325° F./14d/Oil | 22/205/0 | 18/335/10 | 37/148/0 | 25/143/0 | 15/248/60 |
| Cold-Rolled Steel | | | | | |
| Initial | 32/400/100 | 23/1000/100 | 26/830/0 | 23/583/100 | 30/810/100 |
| 325° F./14d | 18/525/0 | 19/600/0 | —/—/— | —/—/— | —/—/— |
| 325° F./14d/Oil | 19/135/15 | 25/111/50 | 28/179/0 | 21/78/0 | 38/28/0 |

*Cast aluminum had to be heated to a higher temperature to effect cure of the sample.

EXAMPLES 7–14

Eight samples were prepared having the formulations set forth in Table 7 below. The term "(pbw)" represents parts by weight. It is to be understood that the "LV Vinyl Polymer-I" in Table 7 below is separate from that used in "LV Polymer/Resin Blend". Likewise, the "Resin Filler" in Table 7 is also separate from that used in "LV Polymer/Resin Blend". Also, the "Resin Hydride" is separate from that used in "RTV-II". The term "pli" refers to pounds per linear inch. Eight laminates were made containing polyimide (1.0 mil), the fomulations shown in Table 7, and aluminum (10.5 mil). The adhesive thicknesses and peel adhesions of the formulations described in Table 7 were measured. The values given for adhesive thickness and peel adhesion are average values.

TABLE 7

Examples 7–14
Formulations and Peel Adhesion Properties

| | Example 7 (pbw) | Example 8 (pbw) | Example 9 (pbw) | Example 10 (pbw) | Example 11 (pbw) | Example 12 (pbw) | Example 13 (pbw) | Example 14 (pbw) |
|---|---|---|---|---|---|---|---|---|
| LV Polymer/Resin Filler Blend | 100 | 1500 | 200 | 200 | 200 | 200 | 200 | 200 |
| LV Vinyl Polymer-I | 0 | 0 | 3.5 | 4.5 | 4.5 | 4.95 | 4.5 | 4.95 |
| Treated Fumed Silica-I | 20 | 400 | 10 | 20 | 40 | 40 | 50 | 50 |
| BTM-SPF | 0 | 0 | 1.5 | 2 | 2 | 2 | 2 | 2 |
| BTM-SPM | 1 | 20 | 0 | 0 | 0 | 0 | 0 | 0 |
| Catalyst-I | 12.5 parts per million | 12.5 parts per million | 0.06 | 0.06 | 0.06 | 0.06 | 0.06 | 0.06 |
| Resin Hydride | 0 | 0 | 3.4 | 4.5 | 4.5 | 4.95 | 4.5 | 4.95 |
| Resin Filler | 0 | 0 | 0 | 0 | 0 | 0 | 0 | 0 |
| RTV-II | 9 | 90 | 0 | 0 | 0 | 0 | 0 | 0 |
| Adhesive Thickness (mils) | 3.57 | 1.87 | 3.57 | 3.3 | 3.08 | 1.88 | 3.55 | 3.85 |
| Peel Adhesion (pli)) | 13.62 | 3.71 | 0.37 | 5.49 | 7.22 | 2.97 | 6.99 | 9.65 |

The results shown in Table 7 indicate that reducing the filler level reduces peel adhesion. Minor variations in catalyst and hydride levels did not appear to cause significant peel adhesion loss.

EXAMPLES 15–28

The composition described in Example 7 was prepared and 14 laminates were made using it and aluminum and polyimide or polyester substrates, each at varying thicknesses.

The cure of the adhesive composition was carried out at 165° C. for 4 minutes. The polyimide and polyester films were not treated prior to contact with the adhesive composition. The Alcad and anodized aluminum substrates were wiped with acetone prior to the coating thereon of the adhesive composition. The peel test was carried out using a 100 pound load cell at 2 inches per minute. The adhesive thickness, peel strength, % bonded width, and mode of failure were measured and the results presented in Table 8 below.

TABLE 8

Example 15–28
Adhesion Properties

| Example No. | Film Type/Gauge | Aluminum Type/Gauge | Adhesive Thickness (mils) | Peel Strength (psi) | % Bonded Width | Mode of Failure |
|---|---|---|---|---|---|---|
| 15 | Polyimide/1 mil | Alcad/62.4 mil | 2.6 | 30.40 | 90%+ | Cohesive |
| 16 | Polyimide/1 mil | Anodized/120.8 mil | 3.0 | 23.42 | 90%+ | Cohesive |
| 17 | Polyimide/1 mil | Anodized/121.4 mil | 3.2 | 20.61 | 40% | Cohesive |
| 18 | Polyimide/3 mil | Alcad/62.2 mil | 3.1 | 17.39 | 35% | Cohesive |
| 19 | Polyimide/3 mil | Alcad/61.7 mil | 4.4 | 15.86 | 90%+ | Cohesive |
| 20 | Polyimide/3 mil | Anodized/121.2 mil | 4.3 | 18.95 | 90% | Cohesive |

TABLE 8-continued

Example 15–28
Adhesion Properties

| Example No. | Film Type/ Gauge | Aluminum Type/ Gauge | Adhesive Thickness (mils) | Peel Strength (psi) | % Bonded Width | Mode of Failure |
|---|---|---|---|---|---|---|
| 21 | Polyester/ 1 mil | Alcad/ 62.3 mil | 6.5 | 16.26* | 90%+ | *Film Break |
| 22 | Polyester/ 1 mil | Alcad/ 61.7 mil | 3.5 | 22.41 | 90%+ | Cohesive |
| 23 | Polyester/ 1 mil | Anodized/ 59.3 mil | 6.4 | 21.06* | 90%+ | *Film Break |
| 24 | Polyester/ 1 mil | Anodized/ 61.1 mil | 9.5 | 37.14* | 85% | *Film Break |
| 25 | Polyester/ 5 mil | Alcad/ 63.0 mil | 8.6 | 33.81 | 35% | Cohesive |
| 26 | Polyester/ 1 mil | Alcad/ 62.5 mil | 7.5 | 36.29 | 80% | Cohesive |
| 27 | Polyester/ 1 mil | Anodized/ 59.4 mil | 7.9 | 29.80 | 40% | Cohesive |
| 28 | Polyester/ 5 mil | Anodized/ 59.4 mil | 12.4 | 25.56 | 35% | Cohesive |

The data presented in Table 8 shows high peel adhesion values were generated for bonding different gauges of polyimide and polyester film to aluminum. All adhesive failure was in the preferred cohesive mode or resulted from film tear. It is to be noted that no special surface preparation, other than a quick acetone solvent wipe on the aluminum, was initiated.

EXAMPLE 29

A composition having the formulation shown in Table 9 was prepared.

TABLE 9

Example 29
Formulation

| Ingredient | Parts By Weight |
|---|---|
| LV Polymer/Resin Blend | 200 |
| Treated Fumed Silica-I | 50 |
| BTMSPM | 2 |
| Catalyst-I | 0.06 |
| LV Vinyl Polymer-I | 4.95 |
| Resin Hydride | 4.95 |

The composition shown in Table 9 was coated onto 12 inch length, 12 inch wide, 12 mil thick aluminum sheets. Then, 1.0 mil Kapton® polyimide film was laminated onto the adhesive-coated aluminum sheets.

EXAMPLES 30–32

Three samples of the Kapton® polyimide film-aluminum laminate prepared in Example 29 were prepared, each having a length of about 10 inches and a pathwidth of about 7 inches.

The sample of Example 30 was pressed in a room temperature Tetrahedron press at 48 Klb. pressure for 3 minutes. The sample was then cut in half and the resulting 2 sub-samples are referred to hereinafter as "sub-sample 30A" and "sub-sample 30B". Sub-sample 30A was cured in a 165° C. oven for 5 minutes and Sub-sample 30B was cured in a 165° C. oven for 10 minutes.

The sample of Example 31 was pressed in a room temperature Tetrahedron press at 48 Klb. pressure for 6 minutes. The sample was then cut in half and the resulting 2 sub-samples are referred to hereinafter as "sub-sample 31A" and "sub-sample 31B". Sub-sample 31A was cured in a 165° C. oven for 5 minutes and Sub-sample 31B was cured in a 165° C. oven for 10 minutes.

The sample of Example 32 was pressed in a room temperature Tetrahedron press at 48 Klb. pressure for 9 minutes. The sample was then cut in half and the resulting 2 sub-samples are referred to hereinafter as "sub-sample 32A" and "sub-sample 32B". Sub-sample 32A was cured in a 165° C. oven for 5 minutes and Sub-sample 32B was cured in a 165° C. oven for 10 minutes.

After curing was complete, subsamples 30A, 30B, 31A, 31B, 32A, and 32B were stored at room temperature overnight. All subsamples had some air bubbles incorporated into the cured adhesive layer.

Sub-sample 30A had an adhesive thickness in the range of of 0.0039 to 0.0086 inches and Sub-sample 30B had an adhesive thickness in the range of of 0.0028 to 0.101 inches. Sub-sample 31A had an adhesive thickness in the range of 0.0018 to 0.0083 inches and Sub-sample 31B had an adhesive thickness in the range of 0.0016 to 0.0082 inches. Sub-sample 32A had an adhesive thickness in the range of 0.0011 to 0.0055 inches and Sub-sample 32B had an adhesive thickness in the range of 0.0008 to 0.0039 inches.

The sub-samples prepared in Examples 30–32 were tested for solder resistance and peel strength. Solder resistance is measured by means of 2 tests: the "10 Second Dip" and the "5 Minute Float" tests. In the 10 Second Dip test, the laminate is dipped into the solder for 10 seconds and then removed. In the 5 Minute Float test, the laminate is floated in the solder material for 5 minutes and then removed. The temperature of the solder material was 600° F. A sample was deemed to pass these tests if the laminate did not delaminate or blister after exposure to the solder. Data from the solder resistance tests are shown in Table 10 and peel strength data are shown in Table 11. In Tables 11, 14, and 17, the term B.S. refers to "before solder", and the term "A.S." refers to "after solder". The term "K/Adh" means adhesive failure occurred on the Kapton® polyimide substrate. The term "Al/Adh" means adhesive failure occurred on the aluminum substrate. The peel test was carried out using a 100 pound load cell at 2 inches per minute.

TABLE 10

Examples 30–32
Solder Resistance

| Sub-sample # | 10 Second Dip | 5 Minute Float |
|---|---|---|
| 30A | Pass | Pass |
| 30B | Pass | Pass |
| 31A | Pass | Pass |
| 31B | Pass | Pass |
| 32A | Pass | Pass |
| 32B | Pass | Pass |

TABLE 11

Examples 30–32
Peel Strength

| Sub-sample | A.R. Peel Strength (pli) | Mode of Failure | A.S. Peel Strength (pli) | Mode of Failure |
|---|---|---|---|---|
| 30A | (3) 13.01 +/− 0.77 | Cohesive | (1) 14.25 | Cohesive |
| 30B | (2) 9.20 +/− 0.43 | Cohesive | (2) 8.41 +/− 0.08 | Cohesive |
| 31A | (3) 11.03 +/− 0.87 | Cohesive | (2) 11.31 +/− 1.48 | Cohesive |
| 31B | (3) 12.29 +/− 0.51 | Cohesive | (2) 12.08 +/− 0.49 | Cohesive |
| 32A | (3) 10.12 +/− 0.50 | Cohesive | (2) 8.36 +/− 0.42 | Cohesive |
| 32B | (3) 9.74 +/− 0.65 | Cohesive | (2) 6.69 +/− 1.13 | Cohesive |

The results presented in Table 11 above indicate that the laminates prepared in Examples 30–32 have excellent solder resistance and excellent adhesion to thin gauged aluminum and Kapton® polyimide. These samples did not exhibit any problems on coating with the aluminum (i.e., no coating deficiencies due to moisture or residual solvent on the aluminum). Peel data indicates that the cure temperature of 165° C. for 5 minutes is slightly better than a 10 minute cure at that temperature.

EXAMPLE 33

A composition having the formulation shown in Table 12 was prepared.

TABLE 12

Example 33
Formulation

| Ingredient | Amount (parts by weight) |
|---|---|
| Vinyl Blend-II | 2210.0 |
| BTMSPF | 22.0 |
| Inhibitor | 1.1 |
| Catalyst II | 0.6 |
| Hydride Fluid | 31.0 |

The composition shown in Table 12 was coated onto 12 inch length, 12 inch wide,12 mil thick aluminum sheets in the following manner: A 5–6 inch line of adhesive (approximately 40 mil) was placed with a spatula about one inch from the edge of the aluminum sheet. A 6 inch wide, 0.25 inch thick sheet of aluminum was held at an angle of approximately 40° and drawn down the length of the aluminum, the angle of the thick hand-held aluminum panel being increased as the coating progressed. The hand-held aluminum was then passed over the sample 2–3 times to smooth out any defects and yield an approximately 20 mil wet coating. A 1-mil sheet of Kapton® polyimide was introduced to one end of the coating and applied to the coating about 1 inch at a time by placing the left index finger on the center of the sample and sweeping one inch increments to the left and then repeating with the right index finger to sweep one inch increments to the right. During application of the Kapton® polyimide to the coating, air bubbles were smoothed off to the side. After working down the length of the sample, air bubbles were rolled out with a hand-held rubber roller, beginning at the center of the sample and rolling to the edge and then repeating this process on the other side.

EXAMPLES 34–36

Three samples of the Kapton® polyimide-aluminum structure prepared in Example 33 above were prepared, each having a length of about 10 inches and a pathwidth of about 7 inches.

The sample of Example 34 was pressed in a room temperature Tetrahedron press at 48 Klb. pressure for 3 minutes. The sample was then cut in half and the resulting 2 sub-samples are referred to hereinafter as "sub-sample 34A" and "sub-sample 34B". Sub-sample 34A was cured in a 165° C. oven for 5 minutes and Sub-sample 34B was cured in a 165° C. oven for 10 minutes.

The sample of Example 35 was pressed in a room temperature Tetrahedron press at 48 Klb. pressure for 6 minutes. The sample was then cut in half and the resulting 2 sub-samples are referred to hereinafter as "sub-sample 35A" and "sub-sample 35B". Sub-sample 35A was cured in a 165° C. oven for 5 minutes and Sub-sample 35B was cured in a 165° C. oven for 10 minutes.

The sample of Example 36 was pressed in a room temperature Tetrahedron press at 48 Klb. pressure for 9 minutes. The sample was then cut in half and the resulting 2 sub-samples are referred to hereinafter as "sub-sample 36A" and "sub-sample 36B". Sub-sample 36A was cured in a 165° C. oven for 5 minutes and Sub-sample 36B was cured in a 165° C. oven for 10 minutes.

After curing was complete, subsamples 34A, 34B, 35A, 35B, 36A, and 36B were stored at room temperature overnight. All subsamples had some air bubbles.

Sub-sample 34A had an adhesive thickness range of 0.0033 to 0.005 inches and Sub-sample 34B had an adhesive thickness range of 0.0035 to 0.007 inches. Sub-sample 35A had an adhesive thickness range of 0.0028 to 0.0034 inches and Sub-sample 35B had an adhesive thickness range of 0.0030 to 0.0032 inches. Sub-sample 36A had an adhesive thickness range of 0.0002 to 0.0006 inches and Sub-sample 36B had an adhesive thickness range of 0.0003 to 0.0009 inches.

The sub-samples prepared in Examples 34–36 were tested for solder resistance and peel strength. Data from the solder resistance tests are shown in Table 13.

TABLE 13

Examples 34–36
Solder Resistance

| Sub-sample # | 10 Second Dip | 5 Minute Float |
|---|---|---|
| 34A | Pass | Pass |
| 34B | Pass | Pass |
| 35A | Pass | Pass |
| 35B | Pass | Pass |
| 36A | Pass | Pass |
| 36B | Pass | Pass |

All samples prepared in Examples 34–36 had some air bubbles (entrapped air from adhesive). The air bubbles expanded slightly when introduced to the solder, but no delamination or blistering was noted. The peel strength data for Examples 34–36 are presented in Table 14.

The peel test was carried out using a 100 pound load cell at 2 inches per minute.

TABLE 14

Example 34–36
Peel Strength

| Sub-sample No. | B.S. Peel Strength (pli) | Mode of Failure | A.S. Peel Strength (pli) | Mode of Failure |
|---|---|---|---|---|
| 34A* | (2) 7.79 +/− 1.4 | K/Adh | (2) 8.72 +/− 2.08 | K/Adh |
| 34B | (2) 11.82 +/− 0.22 | K/Adh | (2) 8.09 +/− 1.00 | K/Adh |
| 35A* | (2) 3.40 +/− 0.62 | Al/Adh | (1) 2.93 | Al/Adh |
| 35B* ** | (3) 2.64 +/− 1.07 | Al/Adh, Cohesive | (2) 1.93 +/− 0.18 | Al/Adh |
| 36A | (2) 1.44 +/− 0.01 | K/Adh | No Sample | No Sample |
| 36B | (3) 1.56 +/− 0.12 | K/Adh | No Sample | No Sample |

*Indicates Aluminum/Adhesive failure, which may be due to contaminants such as water and oil on the surface of the aluminum during the coating process which interfere with the adhesive bonding to the aluminum.
**Sub-sample 35B with cohesive failure exhibited 4.14 pli as received peel strength.

EXAMPLES 37–39

Examples 34–36 were repeated except that all samples were cured at 195° C. The sub-samples of Examples 37A, 38A, and 39A were cured at 195° C. for 5 minutes while those of 37B, 38B, and 39B were cured at 195° C. for 10 minutes.

After curing was complete, subsamples 37A, 37B, 38A, 38B, 39A, and 39B were stored at room temperature overnight. All subsamples had some air bubbles.

Sub-sample 37A had an adhesive thickness range of 0.0032 to 0.0079 inches and Sub-sample 37B had an adhesive thickness range of 0.0021 to 0.0072 inches. Sub-sample 38A had an adhesive thickness range of 0.0019 to 0.0077 inches and Sub-sample 38B had an adhesive thickness range of 0.0018 to 0.0062 inches. Sub-sample 39A had an adhesive thickness range of 0.0017 to 0.0038 inches and Sub-sample 39B had an adhesive thickness range of 0.0011 to 0.0032 inches.

The sub-samples prepared in Examples 37–39 were tested for solder resistance and peel strength. Data from the solder resistance tests are shown in Table 15.

TABLE 15

Examples 37–39: Solder Resistance

| Sub-sample # | 10 Second Dip | 5 Minute Float |
|---|---|---|
| 37A | Pass | Pass |
| 37B | Pass | Pass |
| 38A | Pass | Pass |
| 38B | Pass | Pass |
| 39A | Pass | Pass |
| 39B | Pass | Pass |

All samples prepared in Examples 37–39 had some air bubbles (entrapped air from adhesive). The air bubbles expanded slightly when introduced to the solder, but no delamination or blistering was noted.

The peel strength data for Examples 37–39 are presented in Table 17. The peel test was carried out using a 100 pound load cell at 2 inches per minute.

TABLE 17

Examples 37–39: Peel Strength

| Sub-sample No. | A.R. Peel Strength (pli) | Mode of Failure | A.S. Peel Strength (pli) | Mode of Failure |
|---|---|---|---|---|
| 37A | (2) 10.14 +/− 0.25 | K/Adh | (2) 9.40 +/− 0.03 | K/Adh |
| 37B | (2) 9.37 +/− 0.52 | K/Adh | (2) 6.86 +/− 1.36 | K/Adh |
| 38A* | (2) 3.96 +/− 0.19 | Al/Adh | (1) 5.10 +/− 2.40 | Al/Adh |
| 38B | (3) 3.61 +/− 0.83 | Al/Adh | (2) 6.56 +/− 2.71 | Coh., K/A |
| 39A* ** | (2) 4.05 +/− 1.78 | Al/Adh, K/Adh. | 3.31 +/− 0.65 | Coh., K/A |
| 39B*** | (3) 3.15 +/− 0.55 | Al/Adh K/Adh | 3.03 +/− 0.29 | Al/Adh |

*Indicates Aluminum/Adhesive failure, which may be due to contaminants such as water and oil on the surface of the aluminum during the coating process which interfere with the adhesive bonding to the aluminum.
**Sub-sample 39A with K/Adh failure exhibited 6.55 pli as received peel strength and 3.95 pli after solder peel strength.
***Sub-sample 39B with K/Adh failure exhibited 3.91 pli as received peel strength.

EXAMPLE 40

A composition was prepared having the formulation shown in Table 18 below.

TABLE 18

Example 40: Formulation

| Ingredient | Amount (Parts by Weight) |
| --- | --- |
| Vinyl Blend-II | 221.0 |
| BTMSPF | 2.2 |
| Inhibitor | 0.11 |
| Hydride Fluid | 3.1 |
| Catalyst-I | 0.006 |

The peel adhesion of this sample was measured in a laminate containing polyimide (1.0 mil), the adhesive composition of Table 18 (average thickness of 3.5 mil), and aluminum (10.5 mils). The peel test was carried out using a 100 pound load cell at 2 inches per minute. The average peel adhesion of the laminate was 44.5 pli, and the mode of failure was cohesive.

EXAMPLE 41

Example 41 illustrates the use of allyl-3-trimethoxysilylpropylmaleate as an adhesion promoter in an adhesive composition which can be used in the present invention.

To a beaker was weighed 10 grams of LV-Polymer/Resin Blend, 10 ppm of catalyst, 0.3 grams of allyl-3-trimethoxysilylpropylmaleate, and 1.0 gram of RTV-II. The ingredients were mixed thoroughly. The mixture remained clear but contained a slight haze when compared directly to a mixture identical except for the allyl-3-trimethoxysilylpropylmaleate. The mixture was placed in an aluminum cup and cured at 150° C. for 10 minutes. After curing and cooling, the cured composition adhered tenaciously to the aluminum cup. The sample showed cohesive failure.

Comparison Example A

A composition identical to that prepared in Example 41 was prepared except that it did not contain allyl-3-trimethoxysilylpropylmaleate. The composition prepared in Comparison Example A was cured and cooled in the same manner described in Example 41. The cured composition did not adhere to the cup. This composition showed adhesive failure.

EXAMPLE 42

Example 42 illustrates the use of N-(3-trimethoxysilylpropyl)maleimide as an adhesion promoter in a composition in an adhesive composition which can be used in the present invention. A composition was prepared containing 100 parts by weight of LV Vinyl Polymer-I, 17 parts by weight of treated fumed silica I, 10 ppm of catalyst, and 9 parts by weight of RTV-II. The composition was prepared by mixing the filler and the vinyl base polymer in a double planetary mixer and heating the mixture to a temperature of 130° C.–135° C. for 2 hours at 30 in Hg. The resulting mixture was cooled under vacuum, blended with the catalyst, and then blended with RTV-II.

The composition was then applied to the surface of an alclad aluminum substrate which had been cleaned with isopropanol and the coated substrate was placed in a 200° C. oven for 10 minutes. The bond thickness of the adhesive was 21 mils and the mode of failure was cohesive.

What is claimed is:

1. A multilayered laminate comprising at least three layers and having improved peel strength, comprising:

(1) a first layer, comprising a material selected from:
 (a) plastic materials selected from the group consisting of polyphenylene/styrene blends, polyacrylamides, polystyrenes, conditioned polycarbonates, polyesters, polyimides, polybutylene terephthalates, and polyetherimides;
 (b) metal materials selected from the group consisting of alclad aluminum, anodized aluminum, galvanized steel, cold-rolled steel, cast aluminum, cast magnesium, and copper; and
 (c) glass materials;

(2) a second layer comprising an addition curable silicone adhesive composition directly bonded to the first layer in the absence of a primer, the composition comprising by weight:
 (A) 100 parts of a vinyl-containing polydiorganosiloxane composition comprising:
  (a) from about 50 to about 100 parts by weight of an essentially cyclic-free vinyl-terminated polydiorganosiloxane having the general formula

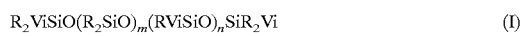

$$R_2ViSiO(R_2SiO)_m(RViSiO)_nSiR_2Vi \quad (I)$$

wherein Vi represents a vinyl radical, R is selected from the class consisting of alkyl radicals of 1 to 8 carbon atoms, phenyl radicals, fluoroalkyl radicals of 3 to 10 carbon atoms and mixtures thereof, wherein "m+n" is a number sufficient to provide a viscosity of 100 to about 100,000 centipoise at 25° C., the vinyl content of the polydiorganosiloxane being from about 0.02 to about 2.0 weight %, and
  (b) from about 0 to about 50 parts by weight of a solid, benzene-soluble vinyl-containing resin copolymer comprising

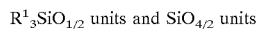

$R^1_3SiO_{1/2}$ units and $SiO_{4/2}$ units wherein each $R^1$ is a vinyl radical or a monovalent hydrocarbon radical free of aliphatic unsaturation and containing no more than six carbon atoms, the ratio of $R^1_3SiO_{1/2}$ units to $SiO_{4/2}$ units from about 0.5:1 to about 1.5:1, the resin having a vinyl content of from about 1.5 to about 3.5% by weight;
 (B) a hydrogen-containing polysiloxane having an average unit formula

$$R^2_aH_bSiO_{(4-a-b)/2,} \quad (II)$$

wherein $R^2$ is a monovalent hydrocarbon radical or halogenated monovalent hydrocarbon radical having from 1 to about 10 carbon atoms and free of aliphatic unsaturation, "a" is a value of from about 0 to about 3, "b" is a value of from about 0 to about 3, and the sum of "a"+"b" is from 0 to 3, there being at least two silicon-bonded hydrogen atoms per molecule; the polysiloxane being present in an amount sufficient to provide a molar ratio of silicon-bonded hydrogen atoms in (B) to olefinically unsaturated radicals in (A) of from about 0.75:1 to about 25:1;
 (C) a catalytic amount of a hydrosilation catalyst;
 (D) an effective amount of an adhesion promoter selected from the group consisting of
  (i) bis[3-(trimethoxysilyl)alkyl]fumarates having the general formula:

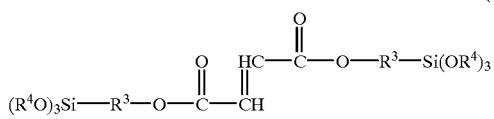
(III)

(ii) bis[3-(trimethoxysilyl)alkyl]maleates having the general formula:

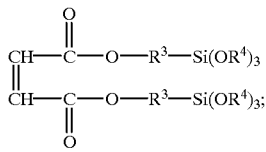
(IV)

(iii) mixtures of (i) and (ii);
(iv) allyl-[3-(trimethoxysilyl)alkyl]maleates having the general formula

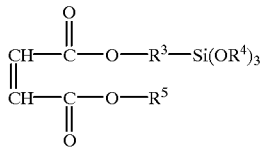
(V)

(v) allyl-[3-(trimethoxysilyl)alkyl]fumarates having the general formula

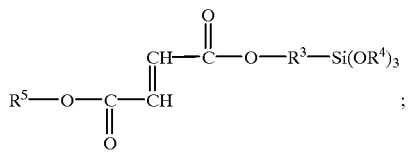
(VI)

and
(vi) N-[3-(trimethoxysilyl)alkyl]maleimides having the general formula

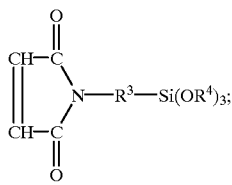
(VII)

wherein $R^3$, $R^4$, and $R^5$ are each alkyl radicals of 1 to about 8 carbon atoms; and
(E) from about 0 to about 200 parts of an extending filler; and
(F) from about 0 to about 50 parts of a reinforcing filler; and
(3) a third layer, to which is directly bonded in the absence of a primer the addition curable silicone adhesive composition of (2), the third layer comprising a material selected from the group consisting of:
(a) plastic materials selected from the group consisting of polyphenylene/styrene blends, polyacrylamides, polystyrenes, conditioned polycarbonates, polyesters, polyimides, polybutylene terephthalates, and polyetherimides;
(b) metal materials selected from the group consisting of alclad aluminum, anodized aluminum, galvanized steel, cold-rolled steel, cast aluminum, cast magnesium, and copper; and
(c) glass materials.

2. A laminate according to claim 1 wherein the first layer is comprised of a polyimide or a polyester material and the third layer is comprised of alclad aluminum, anodized aluminum, or copper.

3. A laminate according to claim 1 wherein $R^3$, $R^4$, and $R^5$ in (2)(D) are each alkyl radicals of 1 to about 4 carbon atoms.

4. A laminate according to claim 2 wherein in (2)(D) $R^3$ is propyl and $R^4$ and $R^5$ are each methyl radicals.

5. A laminate according to claim 1 wherein the linear vinyl-terminated polydiorganosiloxane (2)(A)(a) has a viscosity of from about 3,000 to about 95,000 centipoise at 25° C.

6. A laminate according to claim 1 wherein (2)(A) comprises (a) from about 60 to about 75 parts by weight of the linear vinyl-terminated polydiorganosiloxane, the vinyl-terminated polydiorganosiloxane having a viscosity of from about 65,000 to about 95,000 centipoise at 25° C., and (b) from about 25 to about 40 parts by weight of the solid, benzene-soluble vinyl-containing resin copolymer.

7. A laminate according to claim 1 wherein (2)(A) comprises (a) from about 60 to about 75 parts by weight of the linear vinyl-terminated polydiorganosiloxane, the vinyl-terminated polydiorganosiloxane having a viscosity of from about 3000 to about 5000 centipoise at 25° C., and (b) from about 25 to about 40 parts by weight of the solid, benzene-soluble vinyl-containing resin copolymer.

8. A laminate according to claim 1 wherein the hydrogen-containing polydiorganosiloxane (2)(B) is present in an amount sufficient to provide a molar ratio of silicon-bonded hydrogen atoms in (B) to olefinic unsaturated radicals in (A) of from about 0.75:1 to about 10:1.

9. A laminate according to claim 8 wherein the hydrogen-containing polydiorganosiloxane (2)(B) is present in an amount sufficient to provide a molar ratio of silicon-bonded hydrogen atoms in (B) to olefinic unsaturated radicals in (A) of from about 1.6:1 to about 3.5:1.

10. A laminate according to claim 1 wherein the hydrogen-containing polydiorganosiloxane (2)(B) is an organohydrogensiloxane selected from the group consisting essentially of (1) organohydrogensiloxane fluids having a viscosity of from about 10 to about 1000 centipoise at 25° C. and the general formula

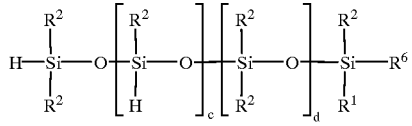

wherein $R^2$ is a monovalent hydrocarbon radical or halogenated monovalent hydrocarbon radical having from 1 to about 10 carbon atoms and free of aliphatic unsaturation, $R^6$ is $R^2$ or hydrogen, "c" and "d" are values such that the sum of "c"+"d" is sufficient to provide a viscosity of from about 10 to about 1000, the organohydrogensiloxane fluid having a hydrogen content of from about 0.02 to about 1.6% by weight; (2) a hydrogen-siloxane copolymer resin comprising $SiO_{4/2}$ units and $R^2_2HSiO_{1/2}$ units; the ratio of $R^2_2HSiO_{1/2}$ units to SiO$_{4/2}$ units being from about 0.4:1 to about 2.0:1, the hydrogensiloxane copolymer resin having a hydrogen content of from about 0.8 to about 1.2% by weight; and (3) linear triorgano-endstopped organohydrogen-polysiloxane fluids having the formula $(R^2)_3SiO(HR^2SiO)_eSi(R^2)_3$, a viscosity of from about 10 to about 40 centistokes at 25° C. and a hydrogen content of about 1.6% by weight.

11. A laminate according to claim 1 wherein (2)(A) comprises (a) from about 60 to about 75 parts by weight of the linear vinyl-terminated polydiorganosiloxane, the vinyl-terminated polydiorganosiloxane having a viscosity of from about 3000 to about 5000 centipoise at 25° C., and (b) from about 25 to about 40 parts by weight of the solid, benzene-soluble vinyl-containing resin copolymer and (2)(B) is a linear triorgano-endstopped organohydrogenpolysiloxane fluid having a viscosity of from about 15 to about 40 centistokes at 25° C. and a hydrogen content of from about 1.6% by weight, the triorgano-endstopped organohydrogen-polysiloxane being present in an amount sufficient to provide a molar ratio of silicon-bonded hydrogen atoms in (2)(B) to olefinic unsaturated radicals in (2)(A) of at least 2.1:1.

12. A laminate according to claim 1 wherein the adhesion promoter (2)(D) is present in an amount ranging from about 0.5 to about 2.0 percent by weight.

13. A laminate according to claim 12 wherein the adhesion promoter (2)(D) is present in an amount ranging from about 0.75 to about 1.25 percent by weight.

14. A laminate according to claim 1 wherein in (2)(D) $R^3$ is propyl.

15. A laminate according to claim 1 wherein in (2)(D) $R^4$ and $R^5$ are each methyl.

16. A laminate according to claim 1 wherein the adhesion promoter (2)(D) is a bis[3-(trimethoxysilyl)alkyl]fumarate having the general formula:

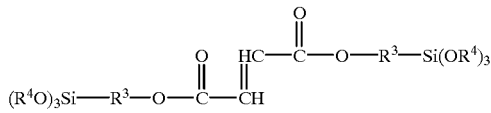

wherein $R^3$ and $R^4$ are each alkyl radicals having from 1 to about 8 carbon atoms.

17. A laminate according to claim 16 wherein $R^3$ and $R^4$ are each alkyl radicals having from 1 to about 4 carbon atoms.

18. A laminate according to claim 1 wherein the adhesion promoter (2)(D) is a bis[3-(trimethoxysilyl)propyl]fumarate.

19. A laminate according to claim 1 wherein the adhesion promoter is a bis[3-(trialkoxysilyl)alkyl]maleate having the general formula:

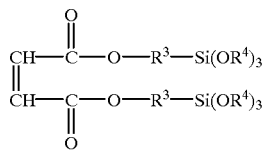

wherein in (2)(D) $R^3$ and $R^4$ are each alkyl radicals having from 1 to about 8 carbon atoms.

20. A laminate according to claim 19 wherein $R^3$ and $R^4$ are each alkyl radicals having from 1 to about 4 carbon atoms.

21. A laminate according to claim 20 wherein the adhesion promoter is a bis[3-(trimethoxysilyl)propyl]maleate.

22. A laminate according to claim 1 wherein (2)(A)(b) further comprises (i) $R^1{}_2SiO_{2/2}$ units, (ii) $R^1SiO_{1/2}$ units, or both (i) and (ii), the $R^1{}_2SiO_{2/2}$ units being present in an amount equal to from about 0 to about 10 mole percent based on the total number of moles of siloxane units in (2)(A)(b); and the $R^1SiO_{1/2}$ units being present in an amount equal to from about 0 to about 10 mole percent based on the total number of moles of siloxane units in (2)(A)(b).

23. A laminate according to claim 1 wherein (2)(E) is present in an amount ranging from about 25 to about 75 parts by weight.

24. A laminate according to claim 1 wherein the extending filler is alpha-quartz.

25. A laminate according to claim 1 wherein (2)(F) is present in an amount ranging from about 20 to about 50 parts by weight.

26. A laminate according to claim 1 wherein the reinforcing filler (2)(F) is treated fumed silica.

27. A laminate according to claim 1 wherein the hydrosilation catalyst (2)(C) is a platinum-containing hydrosilation catalyst.

28. A laminate according to claim 27 wherein the platinum-containing hydrosilation catalyst is selected from the group consisting of (i) a platinum catalyst solution comprising about 90.9% by weight of octyl alcohol and 9.1% by weight of chloroplatinic acid and (ii) a platinum complex formed by reacting chloroplatinic acid with tetravinylcyclotetrasiloxane in the presence of sodium bicarbonate in an ethanol solution.

29. A laminate according to claim 1 wherein (2)(A) comprises (1) 100 parts by weight of a blend containing from about 25 to about 35 parts by weight of a vinyl containing polydiorganosiloxane having a viscosity of 3000 to about 5000 centipoise at 25° C. and from about 65 to about 75 parts by weight of a vinyl containing polydiorganosiloxane having a viscosity of 65,000 to about 95,000 centipoise at 25° C., the total amount of (1) being 100 parts by weight.

30. A laminate according to claim 29 further comprising (2) from about 5.5 to about 7.5 parts by weight of a low viscosity polydiorganosiloxane composition having an average of at least one vinyidiorganosiloxy endgroup, a vinyl content of from about 0.2 to about 0.3% by weight and a viscosity of from about 400 to about 700 centipoise at 25° C. and (3) from about 5.5 to about 7.5 parts by weight of a low viscosity vinyldiorgano-endstopped vinylorganodiorganopolysiloxane having a vinyl content of from about 1.4 to about 2.0% by weight and a viscosity of from about 300 to about 600 centipoise at 25° C.

31. A laminate according to claim 1 wherein the second layer is in the cured state.

32. A multlayered laminate having improved peel strength and comprising:
(1) a first layer, comprising a material selected from the group consisting of:
(a) plastic materials selected from the group consisting of polyphenylene/styrene blends, polyacrylamides, polystyrenes, conditioned polycarbonates, polyesters, polyimides, polybutylene terephthalates, and polyetherimides;
(b) metal materials selected from the group consisting of alclad aluminum, anodized aluminum, galvanized steel, cold-rolled steel, cast aluminum, cast magnesium, and copper; and
(c) glass materials;
(2) a second layer comprising an addition cured silicone adhesive composition directly bonded to the first layer in the absence of a primer, the composition comprising by weight:

(A) 100 parts of a vinyl-containing polydimethylsiloxane composition comprising:
  (a) from about 60 to about 75 parts by weight of a linear vinyl-terminated polydimethylsiloxane having a viscosity of from about 3000 to about 5000 centipoise at 25° C., the vinyl content of the polydiorganosiloxane being from about 0.02 to about 2.0 weight %; and (b) from about 25 to about 40 parts by weight of the solid, benzene-soluble vinyl-containing resin copolymer comprising $(CH_3)_3SiO_{1/2}$ units and $SiO_{4/2}$ units, the ratio of $(CH_3)_3SiO_{1/2}$ units to $SiO_{4/2}$ units from about 0.5:1 to about 1.5:1, the resin having a vinyl content of from about 1.5 to about 3.5% by weight;
(B) a hydrogen-siloxane copolymer resin comprising $SiO_{4/2}$ units and $R^2{}_2HSiO_{1/2}$ units; the ratio of $R^2{}_2HSiO_{1/2}$ units to $SiO_{4/2}$ units being from about 0.4:1 to about 2.0:1, the hydrogensiloxane copolymer resin having a hydrogen content of from about 0.8 to about 1.2% by weight; the polysiloxane being present in an amount sufficient to provide a molar ratio of silicon-bonded hydrogen atoms in (B) to olefinically unsaturated radicals in (A) of at least 0.75:1;
(C) a catalytic amount of a platinum-containing hydrosilation catalyst is selected from the group consisting of (i) a platinum catalyst solution comprising about 90.9% by weight of octyl alcohol and 9.1% by weight of chloroplatinic acid and (ii) a platinum complex formed by reacting chloroplatinic acid containing 4 moles of water of hydration with tetravinylcyclotetrasiloxane in the presence of sodium bicarbonate in an ethanol solution;
(D) from about 0.75 to about 1.25% by weight of an adhesion promoter selected from the group consisting of (i) bis[3-(trimethoxysilyl)-propyl]fumarates, (ii) bis[3-(trimethoxysilyl)propyl]maleates; and (iii) mixtures of (i) and (ii);
(E) 0 parts of alpha-quartz; and
(F) from about 20 to about 50 parts of a treated fumed silica filler reinforcing filler;
(3) a third layer, to which is directly bonded in the absence of a primer the addition curable silicone adhesive composition of (2), the third layer comprising a material selected from the group consisting of:
  (a) plastic materials selected from the group consisting of polyphenylene/styrene blends, polyacrylamides, polystyrenes, conditioned polycarbonates, polyesters, polyimides, polybutylene terephthalates, and polyetherimides;
  (b) metal materials selected from the group consisting of alclad aluminum, anodized aluminum, galvanized steel, cold-rolled steel, cast aluminum, cast magnesium, and copper; and
  (c) glass materials.
33. A laminate according to claim 32 wherein the first layer is comprised of a polyimide or a polyester material and the third layer is comprised of alclad aluminum, anodized aluminum, or copper.
34. A laminate according to claim 33 wherein the second layer is in the cured state.
35. A multilayered laminate having improved peel strength and comprising:
  (1) a first layer the surface of which is free of surface oil, comprising a material selected from the group consisting of:

(a) plastic materials selected from the group consisting of polyphenylene/styrene blends, polyacrylamides, polystyrenes, conditioned poiycarbonates, polyesters, polyimides, polybutylene terephthalates, and polyetherimides;
  (b) metal materials selected from the group consisting of alclad aluminum, anodized aluminum, galvanized steel, cold-rolled steel, cast aluminum, cast magnesium, and copper; and
  (c) glass materials;
(2) a second layer comprising an addition curable silicone adhesive composition directly bonded to the first layer in the absence of a primer, the composition comprising by weight:
  (A) 100 parts by weight of:
    (1) a blend containing from about 25 to about 35 parts by weight of a vinyl-containing polydiorganosiloxane of formula (I) and having a viscosity of 3000 to about 5000 centipoise at 25° C. and from about 65 to about 75 parts by weight of a vinyl-containing polydiorganosiloxane of formula (I) above and having a viscosity of 75,000 to about 95,000 centipoise at 25° C., the total amount of (1) being 100 parts by weight;
    (2) from about 5.5 to about 7.5 parts by weight of a low viscosity polydiorganosiloxane composition having an average of at least one vinyldiorganosiloxy endgroup, a vinyl content of from about 0.2 to about 0.3% by weight and a viscosity of from about 400 to about 700 centipoise at 25° C.;
    (3) from about 5.5 to about 7.5 parts by weight of a low viscosity vinyidiorgano-endstopped vinylorganodiorganopolysiloxane having a vinyl content of from about 1.4 to about 2.0% by weight and a viscosity of from about 300 to about 600 centipoise at 25° C.; and
    (4) 0 parts by weight of the (2)(A)(2);
  (B) a hydrogen-containing polysiloxane having an average unit formula $$R^2{}_aH_bSiO_{(4-a-b)/2},\qquad(1)$$

wherein $R^2$ is a monovalent hydrocarbon radical or halogenated monovalent hydrocarbon radical having from 1 to about 10 carbon atoms and free of aliphatic unsaturation, "a" is a value of from about 0 to about 3, "b" is a value of from about 0 to about 3, and the sum of "a"+"b" is from 0 to 3, there being at least two silicon-bonded hydrogen atoms per molecule; the polysiloxane being present in an amount sufficient to provide a molar ratio of silicon-bonded hydrogen atoms in (B) to olefinically unsaturated radicals in (A) of from about 0.75:1 to about 25:1;
  (C) a catalytic amount of a hydrosilation catalyst;
  (D) an effective amount of an adhesion promoter selected from the group consisting of
    (i) bis[3-(trimethoxysilyl)alkyl]fumarates having the general formula:

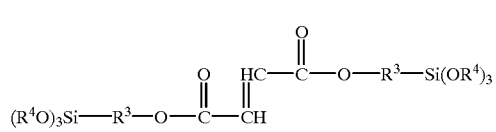

(ii) bis[3-(trimethoxysilyl)alkyl]maleates having the general formula:

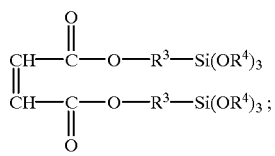

(iii) mixtures of (i) and (ii);
(iv) allyl-[3-(trimethoxysilyl)alkyl]maleates having the general formula

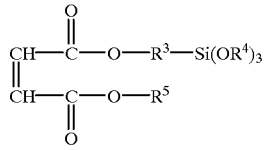

(v) allyl-[3-(trimethoxysilyl)alkyl]fumarates having the general formula

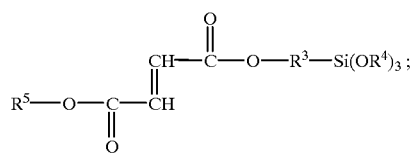

(vi) N-[3-(trimethoxysilyl)alkyl]maleimides having the general formula

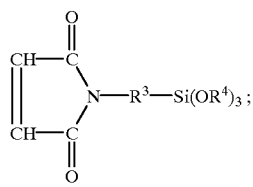

wherein $R^3$, $R^4$, and $R^5$ are each alkyl radicals of 1 to about 8 carbon atoms; and
(E) from about 0 to about 200 parts of an extending filler; and
(F) from about 0 to about 50 parts of a reinforcing filler; and
(3) a third layer, to which is directly bonded in the absence of a primer the addition curable silicone adhesive composition of (2), the third layer comprising a material selected from the group consisting:
(a) plastic materials selected from the group consisting of polyphenylene/styrene blends, polyacrylamides, polystyrenes, conditioned polycarbonates, polyesters, polyimides, polybutylene terephthalates, and polyetherimides;
(b) metal materials selected from the group consisting of alclad aluminum, anodized aluminum, galvanized steel, cold-rolled steel, cast aluminum, cast magnesium, and copper; and
(c) glass materials.
36. A multilayered laminate according to claim 35 wherein (2) comprises 0 parts by weight of extending filler (2)(E).

37. A multlayered laminate having improved peel strength and comprising a plurality of alternating layers, comprising:
(1) a plurality of substrate layers, each layer comprising a material selected from the group consisting of:
(a) plastic materials selected from the group consisting of polyphenylene/styrene blends, polyacrylamides, polystyrenes, conditioned polycarbonates, polyesters, polyimides, polybutylene terephthaiates, and polyetherimides;
(b) metal materials selected from the group consisting of alclad aluminum, anodized aluminum, galvanized steel, cold-rolled steel, cast aluminum, cast magnesium, and copper; and
(c) glass materials;
(2) an adhesive layer separating each substrate layer from a preceding or succeeding substrate layer, the adhesive layer comprising an addition curable silicone adhesive composition directly bonded to the substrate layers in the absence of a primer, the composition comprising by weight:
(A) 100 parts of a vinyl-containing polydiorganosiloxane composition comprising:
(a) from about 50 to about 100 parts by weight of an essentially cyclic-free vinyl-terminated polydiorganosiloxane having the general formula $$R_2ViSiO(R_2SiO)_m(RViSiO)_nSiR_2Vi \qquad (I)$$

wherein Vi represents a vinyl radical, R is selected from the class consisting of alkyl radicals of 1 to 8 carbon atoms, phenyl radicals, fluoroalkyl radicals of 3 to 10 carbon atoms and mixtures thereof, wherein "m+n" is a number sufficient to provide a viscosity of 100 to about 100,000 centipoise at 25° C., the vinyl content of the polydiorganosiloxane being from about 0.02 to about 2.0 weight %, and
(b) from about 0 to about 50 parts by weight of a solid, benzene-soluble vinyl-containing resin copolymer comprising $R^1_3SiO_{1/2}$ units and $SiO_{4/2}$ units wherein each $R^1$ is a vinyl radical or a monovalent hydrocarbon radical free of aliphatic unsaturation and containing no more than six carbon atoms, the ratio of $R^1_3SiO_{1/2}$ units to $SiO_{4/2}$ units from about 0.5:1 to about 1.5:1, the resin having a vinyl content of from about 1.5 to about 3.5% by weight;
(B) a hydrogen-containing polysiloxane having an average unit formula $$R^2_aH_bSiO_{(4-a-b)/2,} \qquad (II)$$

wherein $R^2$ is a monovalent hydrocarbon radical or halogenated monovalent hydrocarbon radical having from 1 to about 10 carbon atoms and free of aliphatic unsaturation, "a" is a value of from about 0 to about 3, "b" is a value of from about 0 to about 3, and the sum of "a"+"b" is from 0 to 3, there being at least two silicon-bonded hydrogen atoms per molecule; the polysiloxane being present in an amount sufficient to provide a molar ratio of silicon-bonded hydrogen atoms in (B) to olefinically unsaturated radicals in (A) of from about 0.75:1 to about 25:1;
(C) a catalytic amount of a hydrosilation catalyst;
(D) an effective amount of an adhesion promoter selected from the group consisting of (i) bis[3-(trimethoxysilyl)alkyl]fumarates having the general formula:

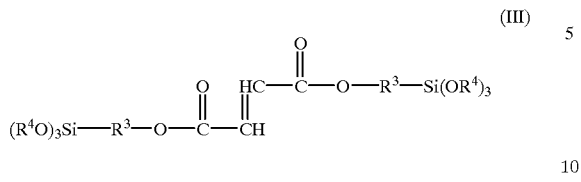
(III)

(ii) bis[3-(trimethoxysilyl)alkyl]maleates having the general formula: (IV)

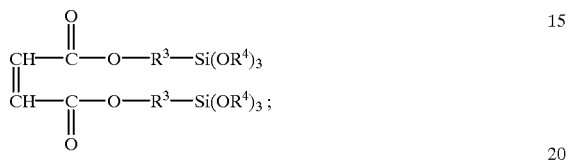

(iii) mixtures of (i) and (ii);
(iv) allyl-[3-(trimethoxysilyl)alkyl]maleates having the general formula

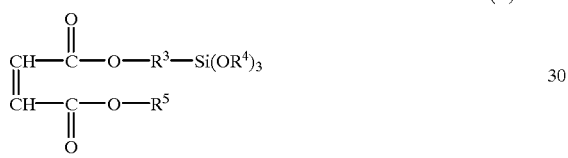
(V)

(v) allyl-[3-(trimethoxysilyl)alkyl]fumarates having the general formula

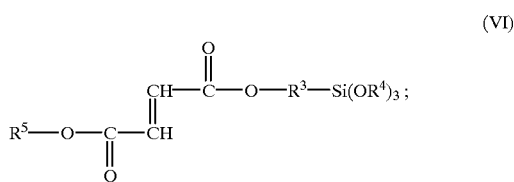
(VI)

(vi) N-[3-(trimethoxysilyl)alkyl]maleimides having the general formula

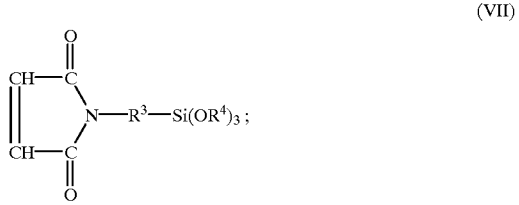
(VII)

wherein $R^3$, $R^4$, and $R^5$ are each alkyl radicals of 1 to about 8 carbon atoms; and (E) from about 0 to about 200 parts of an extending filler; and
(F) from about 0 to about 50 parts of a reinforcing filler.

* * * * *